United States Patent
Nakamura

(10) Patent No.: US 11,367,717 B2
(45) Date of Patent: Jun. 21, 2022

(54) STORAGE DEVICE AND METHOD OF MAKING THE SAME

(71) Applicant: KIOXIA CORPORATION, Tokyo (JP)

(72) Inventor: Masaki Nakamura, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/003,928

(22) Filed: Aug. 26, 2020

(65) Prior Publication Data

US 2021/0091060 A1 Mar. 25, 2021

(30) Foreign Application Priority Data

Sep. 20, 2019 (JP) .............................. JP2019-171095

(51) Int. Cl.
| | | |
|---|---|---|
| G11C 16/04 | (2006.01) | |
| H01L 25/18 | (2006.01) | |
| H01L 25/00 | (2006.01) | |
| H01L 23/00 | (2006.01) | |

(52) U.S. Cl.
CPC .............. *H01L 25/18* (2013.01); *H01L 24/94* (2013.01); *H01L 25/50* (2013.01); *H01L 24/45* (2013.01); *H01L 2924/1438* (2013.01)

(58) Field of Classification Search
CPC ......... H01L 25/18; H01L 24/94; H01L 25/50; H01L 24/45; H01L 2924/1438
See application file for complete search history.

(56) References Cited

U.S. PATENT DOCUMENTS

| | | | |
|---|---|---|---|
| 9,299,767 B1 | 3/2016 | Meldrim et al. | |
| 9,755,503 B2 * | 9/2017 | Kim | ....................... G11C 5/148 |
| 9,786,389 B2 * | 10/2017 | Jung | ..................... G06F 3/0626 |
| 10,211,166 B2 | 2/2019 | Matsuo | |
| 10,923,462 B2 * | 2/2021 | Hirano | .................... H01L 24/48 |
| 2016/0079164 A1 | 3/2016 | Fukuzumi et al. | |
| 2019/0088676 A1 | 3/2019 | Tagami et al. | |

FOREIGN PATENT DOCUMENTS

JP 2016062901 A 4/2016

\* cited by examiner

*Primary Examiner* — Pho M Luu
(74) *Attorney, Agent, or Firm* — Kim & Stewart LLP

(57) ABSTRACT

A storage device includes a first die and a second die. The first die is stacked on the second die. The first die includes a plurality of die regions partitioned by dicing regions. Each of the die regions includes a memory cell array. The second die includes a circuit configured to process reading of data from and writing of data to, memory cells in the memory cell arrays in each of the die regions of the first die.

19 Claims, 8 Drawing Sheets

FIG. 1
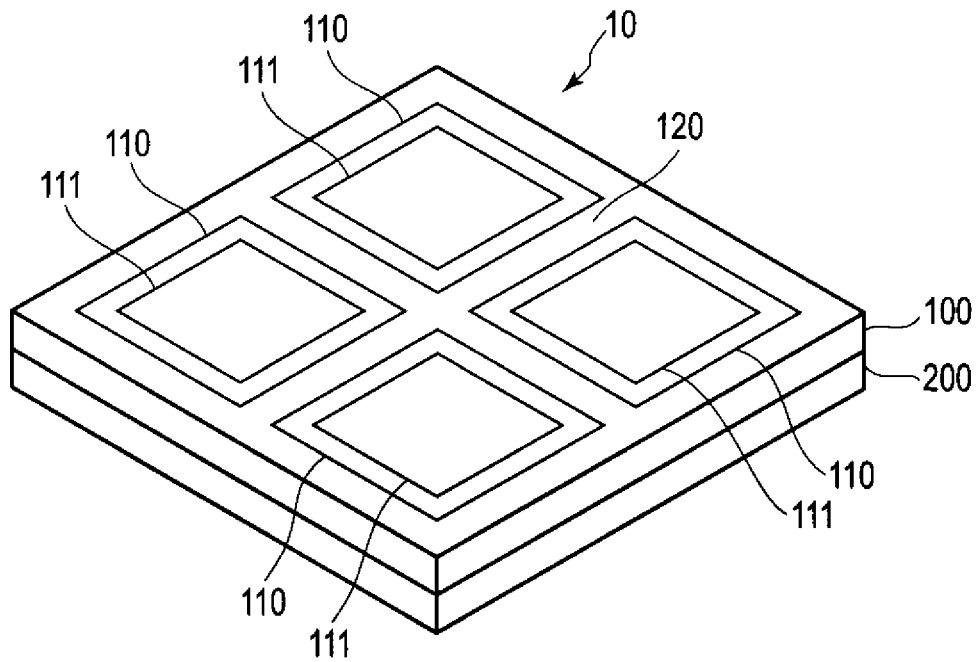
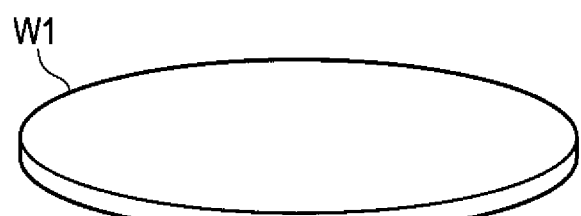
FIG. 2A
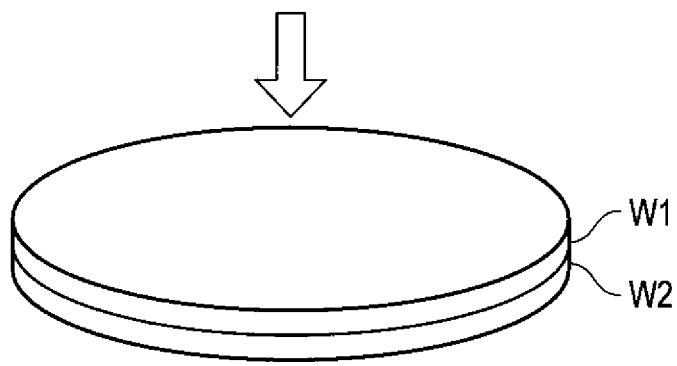
FIG. 2B

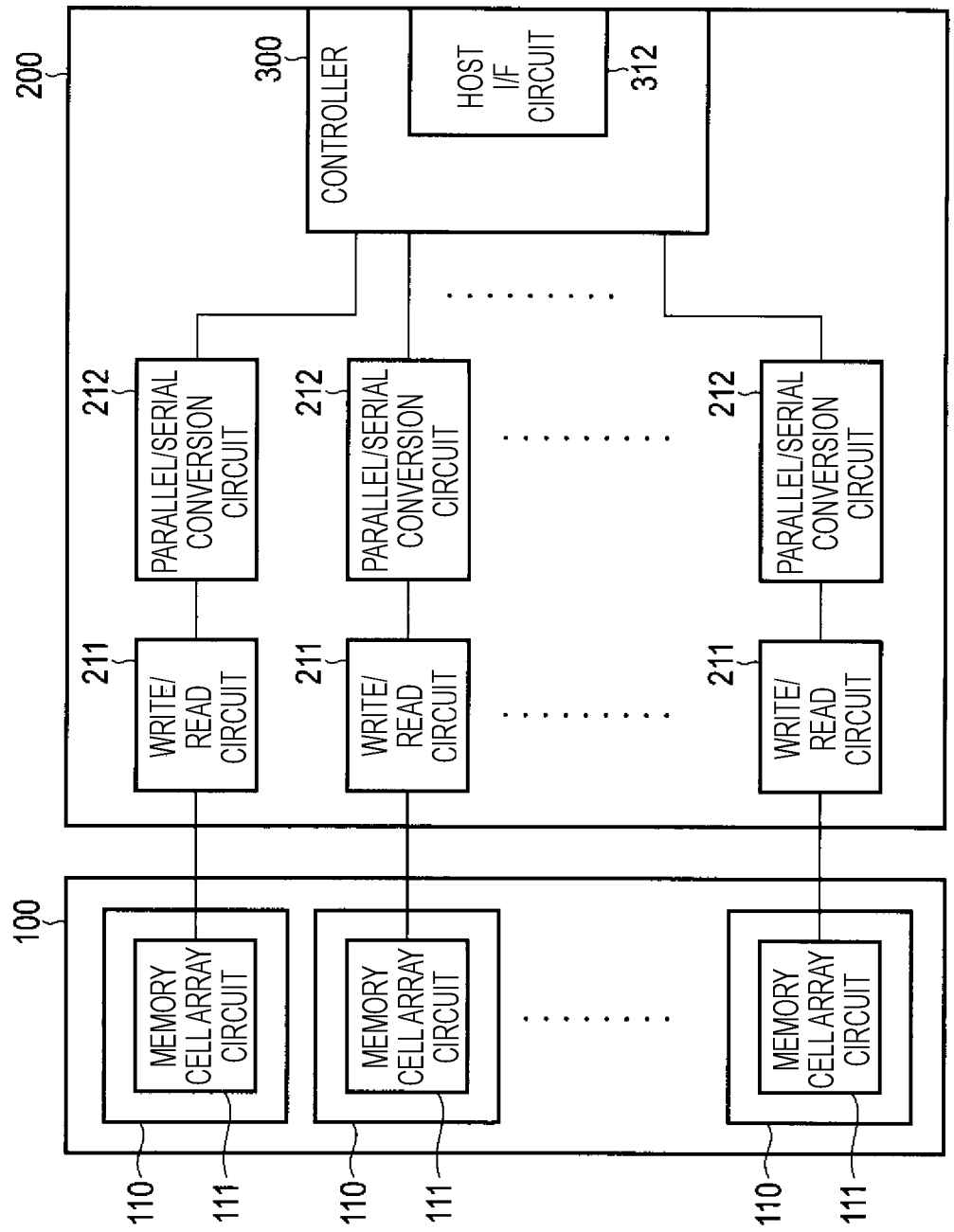

STORAGE DEVICE AND METHOD OF MAKING THE SAME

CROSS-REFERENCE TO RELATED APPLICATION(S)

This application is based upon and claims the benefit of priority from Japanese Patent Application No. 2019-171095, filed on Sep. 20, 2019, the entire contents of which are incorporated herein by reference.

FIELD

Embodiments described herein relate generally to a storage device and a method of making a storage device.

BACKGROUND

In a storage device using a flash memory or the like, improvement in performance such as higher speed and lower power consumption has become more important.

The performance of the storage devices available in the related art could still be further improved.

BRIEF DESCRIPTION OF THE DRAWINGS

FIG. 1 is a perspective view schematically illustrating a configuration of a storage device according to an embodiment.

FIGS. 2A and 2B are views illustrating a method of manufacturing the storage device according to an embodiment.

FIG. 11 is a block diagram of a storage device according to a modification of an embodiment.

DETAILED DESCRIPTION

Figure 3:
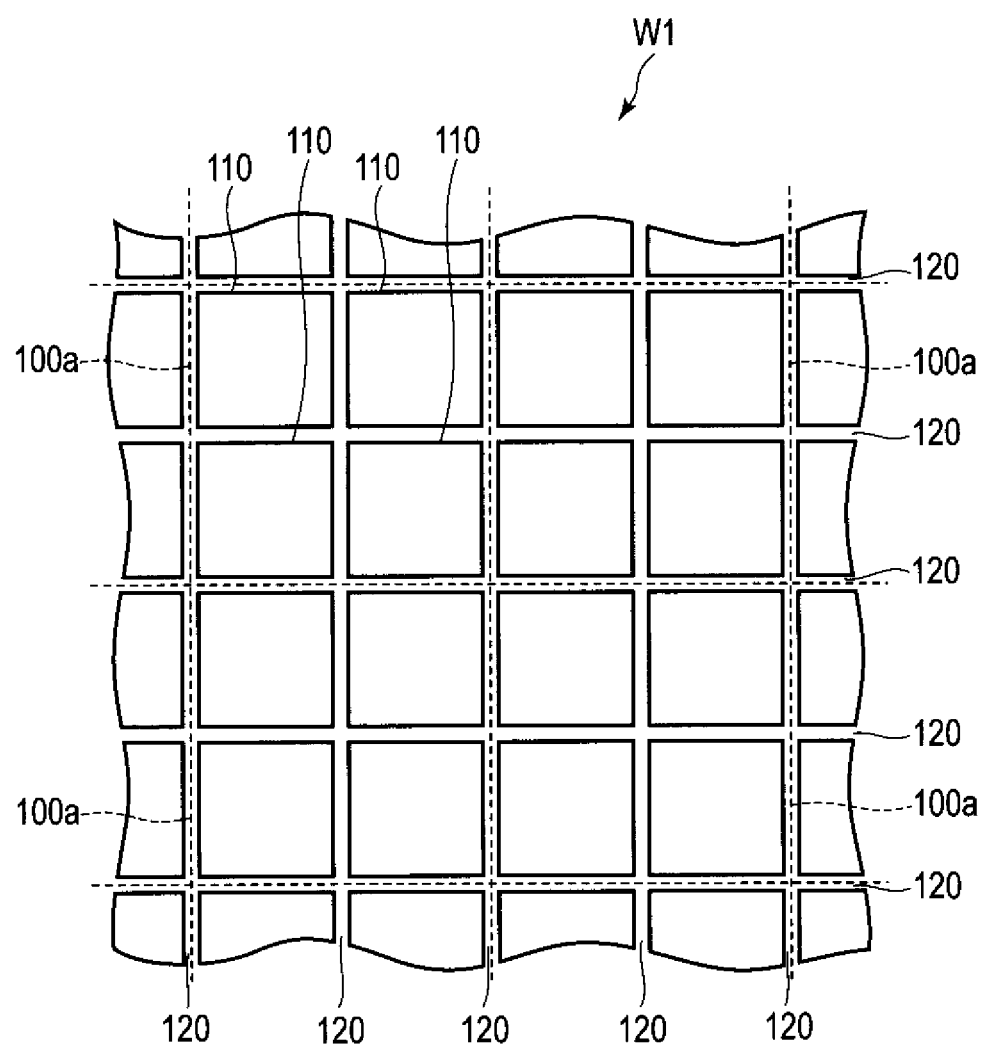
FIG. 3 is a view illustrating aspects related to a method of manufacturing a storage device according to an embodiment, more particularly the figure provides a plan view schematically illustrating a part of a semiconductor wafer.

In general, according to one embodiment, a storage device includes a first die and a second die which are stacked one another. The first die includes a plurality of die regions partitioned by dicing regions, each of the plurality of die regions including a memory cell array, and the second die includes a write/read circuit unit that processes reading of data from and writing of data to, memory cells in the memory cell arrays.

Hereinafter, certain example embodiments will be described with reference to the drawings.

FIG. 1 is a perspective view schematically illustrating a configuration of a storage device according to an embodiment.

As illustrated in FIG. 1, a storage device 10 according to the embodiment has a configuration in which a first die 100 and a second die 200 are stacked. In some contexts, the first die 100 may be referred to as a first chip 100, the second die 200 may be referred to as a second chip 200. The first die 100 and the second die 200 may have the same planar size or different sizes.

The first die 100 includes a plurality of die regions 110 (also referred to as chip regions 110) partitioned from one another by dicing regions 120 (also referred to dicing line regions 120 or "streets" in some contexts). That is, each of the individual die regions 110 is surrounded by the dicing region 120. As for the width of the dicing region 120, the width of the outer peripheral region surrounding all of four die regions 110 is less than the width of the +(plus) shaped region that partitions the four die regions 110. Further, in the example illustrated in FIG. 1, the first die 100 includes four die regions 110, but the number of the die regions 110 in the first die 100 is not particularly limited and may be any number of two or more.

Each die region 110 in the first die 100 includes a memory cell array circuit 111 including a plurality of memory cells, a plurality of first wirings, and a plurality of second wirings. The second die 200 includes a peripheral circuit for the memory cell array circuit 111 of the first die. The peripheral circuit has a function of reading and writing data from and to the memory cell array circuits 111 in each die region 110 of the first die 100. In addition, the second die 200 includes an interface circuit capable of communicating with a controller that controls a memory system including the first die 100 and the second die 200 (corresponding to a controller 300 to be described later). The second die 200 is mainly constituted by CMOS circuits.

In the following description, the first die 100 may be called a memory array die, and the second die 200 may be called a CMOS die.

FIGS. 2A and 2B are views illustrating a method of manufacturing the storage device according to the embodiment.

First, as illustrated in FIG. 2A, a semiconductor wafer W1 for the first die 100 and a semiconductor wafer W2 for the second die 200 are prepared. Integrated circuits are already formed on or in both the semiconductor wafer W1 and the semiconductor wafer W2.

Subsequently, as illustrated in FIG. 2B, the semiconductor wafer W1 and the semiconductor wafer W2 are bonded to each other. By performing a dicing in a state in which the semiconductor wafer W1 and the semiconductor wafer W2 are bonded to each other, the storage device 10 as illustrated in FIG. 1 can be obtained. For example, the semiconductor wafer W1 and the semiconductor wafer W2 may be bonded as a CMOS-bonded-to-array (CBA) type device.

Figure 4:
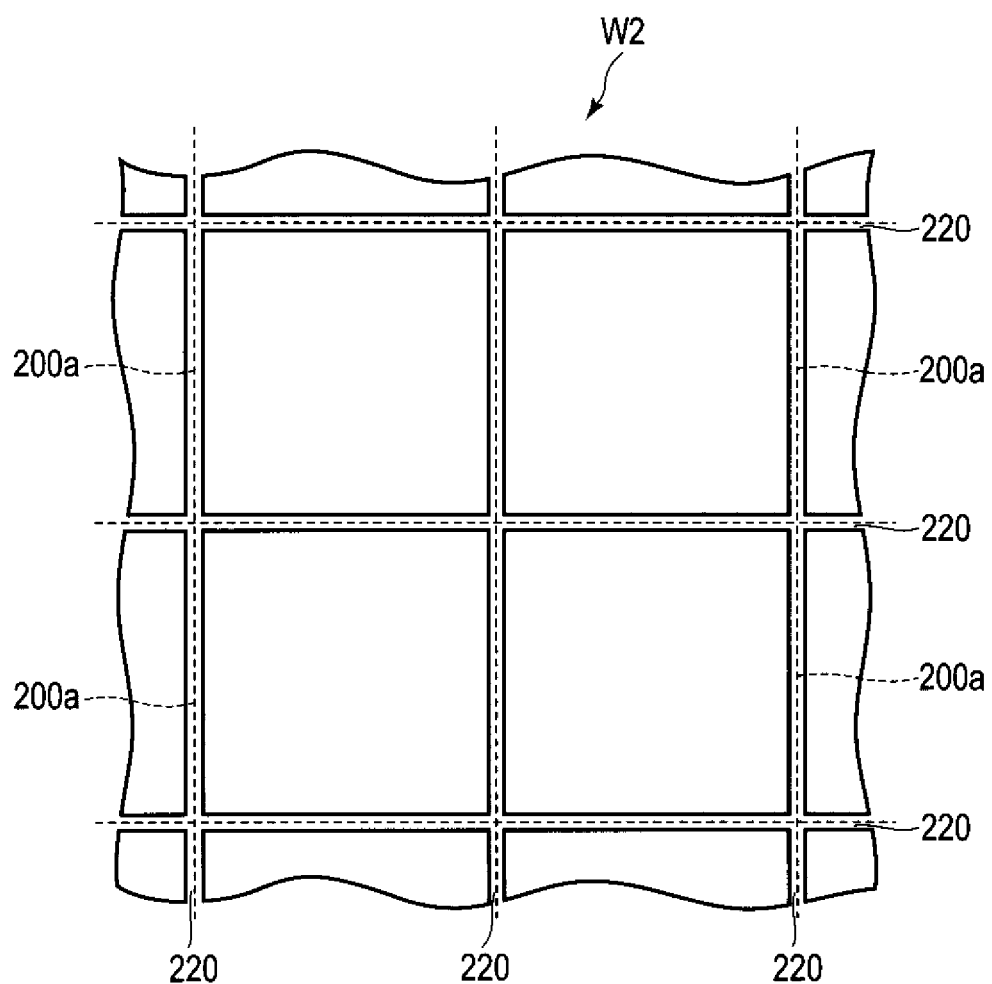
FIG. 4 is a view illustrating aspects related to a method of manufacturing a storage device according to an embodiment, more particularly the figure provides a plan view schematically illustrating a part of another semiconductor wafer.

FIG. 3 is a plan view illustrating a part of the semiconductor wafer W1, and FIG. 4 is a plan view illustrating a part of the semiconductor wafer W2.

As illustrated in FIG. 3, a plurality of first die forming regions 100a is disposed on or in the semiconductor wafer W1. The first die forming regions 100a have the same size (same planar size) as each other and share a common configuration. Further, a plurality of die regions 110 partitioned by dicing regions 120 is disposed on or in the semiconductor wafer W1. The die regions 110 share a common configuration. That is, the die regions 110 have the same size (same planar size), the same circuit configuration, and the same circuit arrangement. The plurality of die regions 110 in the semiconductor wafer W1 are generally designed to be separated as individual dies by dicing along the dicing regions 120. Therefore, the plurality of die regions 110 have the same circuit configuration and the same circuit arrangement as each other. In the example illustrated in FIG. 3, each of the first die forming regions 100*a* includes four die regions 110.

As illustrated in FIG. 4, a plurality of second die forming regions 200*a* is disposed on or in the semiconductor wafer W2. The second die forming regions 200*a* have the same size (same planar size) as each other, and also have the same size (same planar size) as the first die forming regions 100*a* illustrated in FIG. 3. Furthermore, the second die forming regions 200*a* share a common configuration. That is, the second die forming regions 200*a* have the same circuit configuration and the same circuit arrangement as each other.

The semiconductor wafer W1 and the semiconductor wafer W2 are bonded together such that the position of the first die forming region 100*a* illustrated in FIG. 3 matches the position of the second die forming region 200*a* illustrated in FIG. 4, and the semiconductor wafer W1 and the semiconductor wafer W2 are diced simultaneously along the broken lines illustrated in FIGS. 3 and 4, whereby the storage device 10 including the first die 100 (a memory array die) and the second die 200 (a CMOS die) as illustrated in FIG. 1 is obtained.

As described above, each die region 110 in the first die 100 includes the memory cell array circuit 111 that includes a plurality of memory cells, a plurality of first wirings, and a plurality of second wirings. As for the memory cell array circuit 111, a nonvolatile memory cell array having a NAND type planar or three-dimensional memory structure is used in this example.

Figure 5:
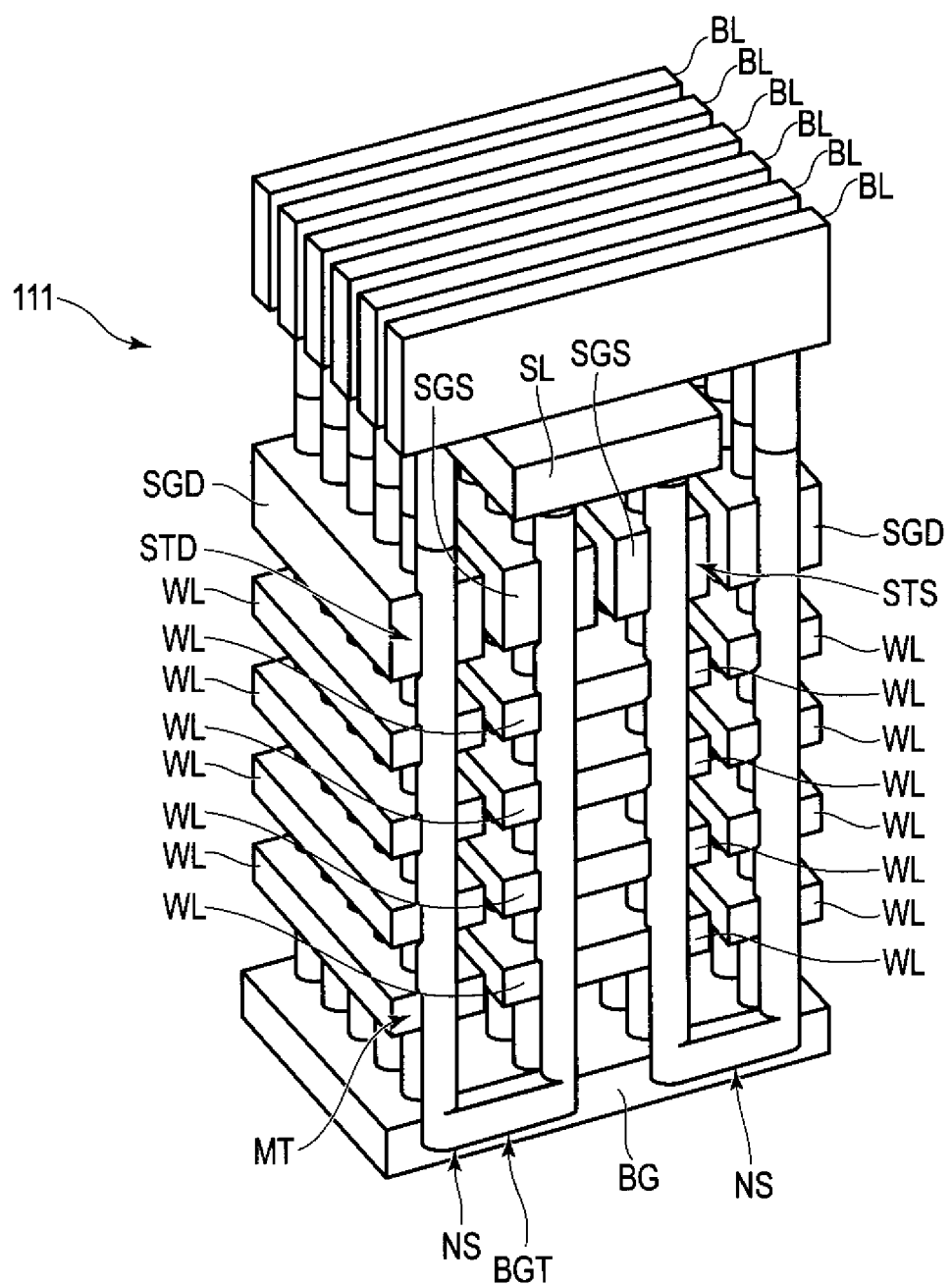
FIG. 5 is a perspective view schematically illustrating a configuration of a memory cell array circuit of a storage device according to an embodiment.

FIG. 5 is a perspective view schematically illustrating a configuration of the memory cell array circuit 111 having the above-described NAND type memory structure.

As illustrated in FIG. 5, the NAND type memory structure of the memory cell array circuit 111 has a structure in which memory cells are stacked in a direction perpendicular to a main surface of the first die 100 (see, e.g., FIG. 1).

The memory cell array circuit 111 includes a plurality of NAND strings NS, and has a structure in which word lines WL and insulating layers (not separately illustrated) are alternately stacked on a back gate BG.

The NAND string NS has a structure in which several memory cell transistors MT are connected in series between a source-side select transistor STS and a drain-side select transistor STD. A select gate SGS line is connected to a gate of the source-side select transistor STS, and a select gate SGD is connected to a gate of the drain-side select transistor STD. A word line WL is connected to a control gate of each memory cell transistor MT.

A source line SL is provided above the source-side select gate line SGS via an insulating layer, and a bit line BL (also referred to as a data line in some contexts) is provided above the drain-side select gate line SGD and the source line SL via the insulating layer.

For example, the memory cell transistor MT, the word line WL, and the bit line BL described above correspond to a memory cell, a first wiring, and a second wiring in the memory cell array circuit 111, respectively.

Figure 6:
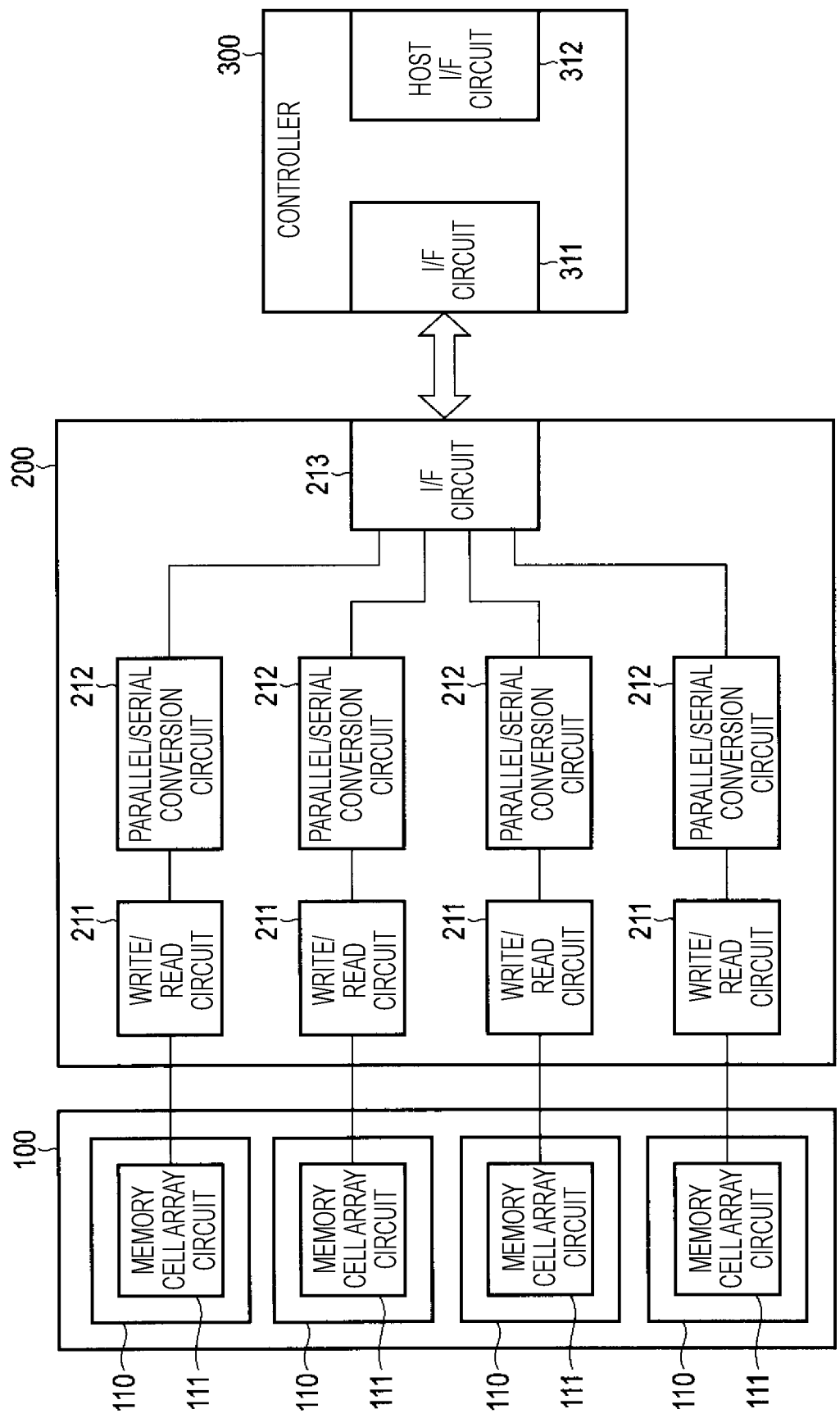
FIG. 6 is a block diagram of a storage device according to an embodiment.

FIG. 6 is a block diagram illustrating a system configuration of the storage device according to the embodiment.

As already described, the first die 100 includes a plurality of die regions 110, and each die region 110 includes a memory cell array circuit 111.

The second die 200 includes a data write/read unit (including a plurality of write/read circuits 211), a conversion unit (including a plurality of parallel/serial conversion circuits 212), and an interface circuit 213 (also referred to as a memory I/F circuit 213). These components function as peripheral circuits for the memory array circuits 111.

The write/read circuits 211 constituting the data write/read unit are provided for each of the die regions 110 with a memory cell array circuit 111. Specifically, each of the write/read circuits 211 is connected to a corresponding memory cell array circuit 111 and controls writing and reading of data to and from the corresponding memory cell array circuit 111.

The first die 100 is provided with a plurality of input/output signal line electrodes corresponding to a plurality of input/output signal lines (e.g., a plurality of word lines WL and a plurality of bit lines BL or electrodes connected thereto), respectively from each of the memory cell array circuits 111 The second die 200 is provided with a plurality of electrodes (e.g., terminals) which are respectively connected to the write/read circuits 211 correspond to the plurality of input/output signal lines from the first die 100. When the semiconductor wafer W1 and the semiconductor wafer W2 illustrated in FIGS. 2A and 2B are bonded to each other, a plurality of electrodes provided on the first die 100 and a plurality of electrodes provided on the second die 200 are connected via a plurality of conductive portions interposed therebetween.

Figure 7:
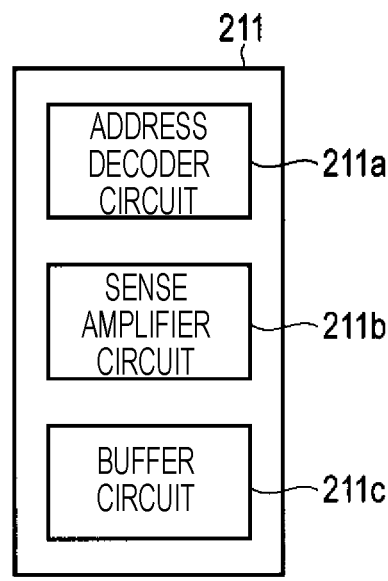
FIG. 7 is a block diagram of a write/read circuit in a second die of a storage device according to an embodiment.

FIG. 7 is a block diagram illustrating a configuration of a write/read circuit 211 in the second die 200.

Each write/read circuit 211 includes an address decoder circuit 211*a*, a sense amplifier circuit 211*b*, and a buffer circuit 211*c* that temporarily stores a signal. The address decoder circuit 211*a* specifies a memory address in the corresponding die region 110 (more particularly a corresponding memory cell array circuit 111) and is connected to the word line WL. Thea sense amplifier circuit 211*b* senses a signal from a bit line BL in the corresponding die region 110 (more particularly a corresponding memory cell array circuit 111). That is, in the embodiment, only the memory cell array circuits 111 (as illustrated in FIG. 5) are provided in the first die 100, and the write/read circuit 211 including the address decoder circuit 211*a*, the sense amplifier circuit 211*b*, and the buffer circuit 211*c* is provided in the second die 200 as peripheral circuits corresponding to the plurality of memory cell array circuits 111.

As illustrated in FIG. 6, a parallel/serial conversion circuit 212 is connected to each write/read circuit 211. A parallel/serial conversion circuit 212 is thus also provided for each of the die regions 110. A signal for the write/read circuit 211 is parallel/serial-converted by the parallel/serial conversion circuit 212. That is, at the time of reading, data from the memory cell array circuit 111 is parallel-to-serial converted and sent to the controller 300, and at the time of writing, data from the controller 300 is serial-to-parallel converted and sent to the memory cell array circuit 111.

The interface circuit 213 is provided as a common circuit for the plurality of write/read circuits 211 and the plurality of parallel/serial conversion circuits 212. With the interface circuit 213, it is possible to communicate with the controller 300. As described above, the controller 300 controls the memory system including the first die 100 and the second die 200. That is, communication may be performed between the interface circuit 213 provided on or in the second die 200 and the interface circuit 311 provided on or in the controller 300. Serial communication may be performed between the interface circuit 213 and the interface circuit 311. Communication between the interface circuit 213 and the interface circuit 311 may be communication based on a standard such as Toggle DDR or ONFi (Open NAND Flash Interface protocol).

In addition, the controller 300 is a semiconductor integrated circuit device which may also be called a universal flash storage (UFS) controller or an SSD controller. The controller 300 includes a host interface circuit 312 (e.g., a high-speed interface such as an MPHY/PCIe interface) capable of communicating with a host device, in addition to the interface circuit 311 for the memory cell array circuit 111. The controller 300 may be implemented as a system on a chip (SoC).

Figure 8:
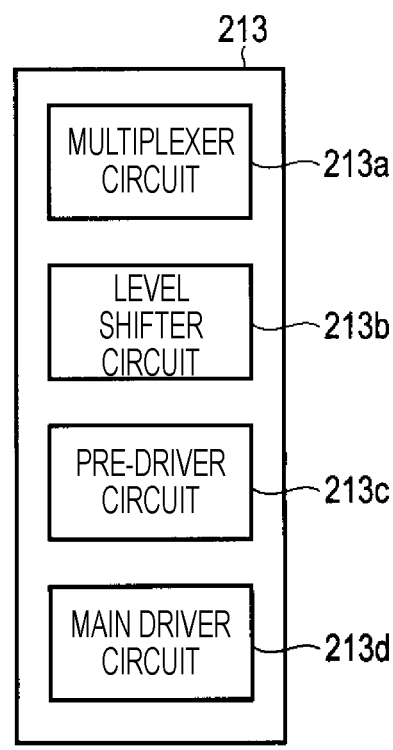
FIG. 8 is a block diagram of an interface circuit in a second die of a storage device according to an embodiment.

FIG. 8 is a block diagram illustrating a configuration of an interface circuit 213 on or in the second die 200. The interface circuit 213 includes a multiplexer circuit 213a, a level shifter circuit 213b, a pre-driver circuit 213c, and a main driver circuit 213d. The multiplexer circuit 213a, the level shifter circuit 213b, the pre-driver circuit 213c, and the main driver circuit 213d are provided as common circuits for the plurality of write/read circuits 211 and the plurality of parallel/serial conversion circuits 212. The multiplexer circuit 213a may select one write/read circuit 211 and one parallel/serial conversion circuit 212 from the plurality of write/read circuits 211 and the plurality of parallel/serial conversion circuits 212.

Figure 9:
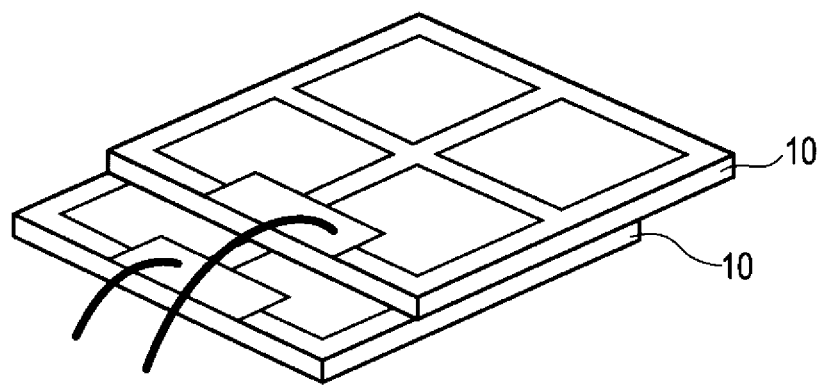
FIG. 9 is a perspective view schematically illustrating a configuration in which storage devices are stacked.

FIG. 9 is a perspective view schematically illustrating a configuration in which storage devices 10 according to an embodiment have been stacked. As described above, a plurality of storage devices 10 may be stacked and perform communication via a wire (e.g., a bonding wire) between the interface circuit 213 provided in each of the storage devices 10 and the interface circuit 311 provided in the controller 300. Furthermore, the storage device(s) 10 may be connected to the controller 300 via a wire connected to one of the first dies 100 in the stack. For example, a first die 100 may be provided with through vias. A through via electrically connects between a terminal provided on a first surface of the first die 100 facing the second die 200 and a terminal provided on a second surface opposite to the first surface. The through via allows a signal line connecting the interface circuit 213 provided on or in the second die 200 and the interface circuit 311 provided on or in the controller 300 to be connected to a wire by being wired on the second surface of the first die 100. In addition, the storage device(s) 10 may be connected to the controller 300 by being wired on the second die 200 including the interface circuit 213. In this case, there is no need to provide a through via in the first die 100, and a through via may instead be provided in the second die 200. The through via allows the wiring of the interface circuit 213 provided on a third surface of the second die 200 facing the first die 100 to be connected to a wire by conducting to a terminal provided on a fourth surface opposite to the third surface.

Figure 10:
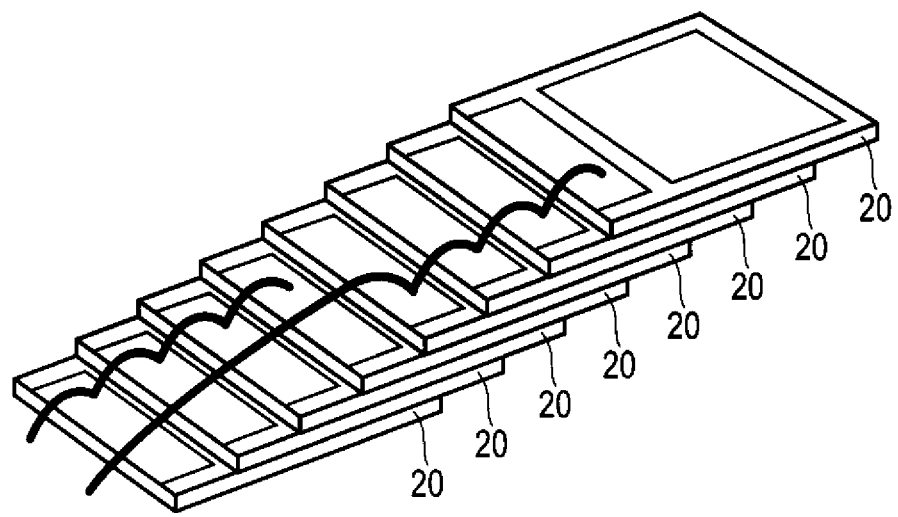
FIG. 10 is a perspective view schematically illustrating a configuration in which storage devices according to a comparative example are stacked.

FIG. 10 is a perspective view schematically illustrating a configuration of a comparative example, and schematically illustrates a configuration in which storage devices 20 according to the comparative example are stacked.

In the storage device 20 of the comparative example, there is only a single die region in each stacked die rather than multiple die regions 110 of the first die 100 of the embodiment. That is, in the comparative example, each of individual stacked chips/dies is obtained by dicing along the dicing line regions rather than the four die regions 110 illustrated in FIG. 3. And each individual stacked chip/die in the comparative example corresponds to just a single memory array die. Therefore, the memory capacity in the memory array die of the comparative example is ¼ of the memory capacity in the memory array die of the embodiment. That is, when the storage device 20 of the comparative example is used, it is necessary to stack four times the storage devices 20 as compared with a case where the storage device 10 of the embodiment is used (see, e.g., FIG. 9).

As described above, when the storage device 20 of the comparative example is used, the number of stacked chips increases, so that the number of memory interfaces connected to one signal line increases and the length of the bonding wire also increases. Therefore, the load of wiring increases, the signal waveform quality deteriorates, and high-speed signal transmission becomes difficult.

When a memory array die (e.g., first die 100) of the embodiment is used, since the number of stacked storage devices 10 may be reduced (or potentially the storage devices 10 do not need to be stacked at all), the above-described problem may be prevented. Further, it is possible to avoid the restriction on the number of stacked layers in the package height direction. That is, in the embodiment, high-speed signal transmission may be performed by preventing the deterioration of the waveform quality, and the mounted memory capacity may be increased by remaining below any restriction on the number of stacked layers in the package height direction. Therefore, in the embodiment, it is possible to obtain a storage device having excellent performance.

FIG. 11 is a block diagram illustrating a system configuration of a storage device according to a modification of the embodiment.

In a modification example, a controller 300 having substantially the same function as the controller 300 illustrated in FIG. 6 is provided on or in the second die 200 itself. In the modification example, since the controller 300 is provided on or in the second die 200, the second die 200 need not be provided with the interface circuit 213 on the storage device 10 side and the interface circuit 311 on the controller 300 side as illustrated in FIG. 6. As described above, in the modification example, since the controller 300 is provided on or in the second die 200, the second die 200 may communicate with a host device by an interface circuit 312 (host interface circuit) in the controller 300.

As described above, in the modification example, since the controller 300 is provided on or in the second die 200, the second die 200 need not be provided with a memory interface circuit 311. Therefore, in the modification example, it is possible to further reduce latency, cost, and power consumption. In addition, since the controller 300 is provided on or in the second die 200, wire bonding for connecting the controller 300 is not required, and one factor in deteriorating the waveform quality is reduced, so that the speed may be further increased.

In the above-described embodiment, the second die 200 may be configured to have an interleaving function, a bus width extending function, and a waveform shaping function (emphasis, equalizing). By providing such functions on the second die 200, it is possible to implement an interface speed that exceeds the operating speed of a single memory cell array.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising
a first die; and
a second die, the first die being stacked on the second die, wherein
the first die includes a plurality of die regions partitioned by regions that correspond to dicing line regions, each of the die regions including a memory cell array, and
the second die includes a write/read circuit unit configured to process reading of data from and writing of data to memory cells in the memory cell arrays in each of the die regions of the first die.

2. The storage device according to claim 1, wherein the write/read circuit unit includes a plurality of write/read circuits for each of the plurality of die regions, respectively.

3. The storage device according to claim 2, wherein each of the plurality of write/read circuits includes:
an address decoder circuit that is connected to a word line connected to the memory cell array in the corresponding die region;
a sense amplifier circuit that is connected to a bit line connected to the memory cell array in the corresponding die region; and
a buffer circuit configured to temporarily store data read from or to be written to the memory cell array corresponding to the die region.

4. The storage device according to claim 2, wherein the second die includes an interface circuit shared by the plurality of read/write circuits.

5. The storage device according to claim 4, wherein the interface circuit includes a multiplexer circuit configured to permit a selection of one of the plurality of write/read circuits.

6. The storage device according to claim 1, wherein the second die includes an interface circuit configured to communicate with a memory system controller.

7. The storage device according to claim 1, wherein the second die includes a memory system controller.

8. The storage device according to claim 7, wherein the second die further includes a host interface circuit configured to communicate with a host device.

9. The storage device according to claim 1, wherein each die region of the plurality of die regions has the same configuration.

10. The storage device according to claim 1, wherein the memory cell array includes a NAND type memory structure.

11. The storage device according to claim 10, wherein the NAND type memory structure has a structure in which memory cells are stacked in a direction perpendicular to a main surface of the first die.

12. A storage device, comprising
a first die including a plurality of die regions each having a same configuration and comprising a memory cell array, each of the die regions being separated from each other by street regions that correspond to dicing line regions; and
a second die including a peripheral circuit, the first die being bonded to the second die, the peripheral circuit being configured to process reading of data from and writing of data to memory cells in the memory cell arrays in each of the die regions of the first die.

13. The storage device according to claim 12, wherein the first die and the second die have the same planar area.

14. The storage device according to claim 12, wherein
the peripheral circuit includes a separate write/read circuit for each of the die regions, and
each write/read circuit includes:
an address decoder circuit that is connected to a word line connected to the memory cell array in the corresponding die region;
a sense amplifier circuit that is connected to a bit line connected to the memory cell array in the corresponding die region; and
a buffer circuit configured to temporarily store data read from or to be written to the memory cell array corresponding to the die region.

15. The storage device according to claim 14, wherein the peripheral circuit includes an interface circuit shared by the read/write circuits.

16. The storage device according to claim 12, wherein the second die includes an interface circuit configured to communicate with a memory system controller.

17. The storage device according to claim 12, wherein the second die includes a memory system controller.

18. The storage device according to claim 17, wherein the second die further includes a host interface circuit configured for communicating with a host device.

19. A method of making a storage device, the method comprising:
forming a plurality of memory cell array dies on a first wafer, each of the memory cell array dies being separated from each other by dicing line regions;
forming a plurality of second dies on a second wafer, the second dies each including a peripheral circuit configured to process reading of data from and writing of data to memory cell arrays, the second dies having a planar area corresponding to a planar area of at least two memory cell array dies, and being separated from adjacent second dies by dicing line regions;
bonding the first wafer to the second wafer such that at least two first dies are electrically connected to the peripheral circuit of the same second die; and
dicing the first and second wafers according to the dicing lines between the second dies.

* * * * *